(12) United States Patent
Brunelli et al.

(10) Patent No.: US 11,965,638 B2
(45) Date of Patent: *Apr. 23, 2024

(54) FRONT ACCESS BATTERY COMPARTMENT

(71) Applicant: HLI SOLUTIONS, INC., Greenville, SC (US)

(72) Inventors: Anthony Brunelli, Piedmont, SC (US); Robert Papstein, Greenville, SC (US)

(73) Assignee: HLI SOLUTIONS, INC., Greenville, SC (US)

( * ) Notice: Subject to any disclaimer, the term of this patent is extended or adjusted under 35 U.S.C. 154(b) by 861 days.

This patent is subject to a terminal disclaimer.

(21) Appl. No.: 17/010,339

(22) Filed: Sep. 2, 2020

(65) Prior Publication Data

US 2021/0003262 A1 Jan. 7, 2021

Related U.S. Application Data

(63) Continuation of application No. 16/005,126, filed on Jun. 11, 2018, now Pat. No. 10,775,010, which is a
(Continued)

(51) Int. Cl.
*G09F 13/04* (2006.01)
*F21S 9/02* (2006.01)
(Continued)

(52) U.S. Cl.
CPC .............. *F21S 9/024* (2013.01); *F21V 15/01* (2013.01); *F21V 21/28* (2013.01); *F21V 23/023* (2013.01); *F21V 23/06* (2013.01); *F21V 33/0076* (2013.01); *G09F 13/0413* (2013.01); *H01M 50/204* (2021.01); *H01M 50/271* (2021.01); *H01M 50/298* (2021.01);
(Continued)

(58) Field of Classification Search
CPC ........................ F21S 9/024; G09F 2013/0459
See application file for complete search history.

(56) References Cited

U.S. PATENT DOCUMENTS

| 2,097,237 A | 10/1937 | Hulst |
| 2,213,584 A | 9/1940 | Hulst |

(Continued)

FOREIGN PATENT DOCUMENTS

| CN | 201373317 Y | 12/2009 |
| CN | 101737696 | 6/2010 |

(Continued)

OTHER PUBLICATIONS

Chinese Patent Application No. 201580066001.9 First Office Action Issued by the China National Intellectual Property Administration (and translation) dated Feb. 28, 2019 (15 pages).
(Continued)

*Primary Examiner* — Shin H Kim
(74) *Attorney, Agent, or Firm* — Buckley, Maschoff & Talwalkar LLC

(57) ABSTRACT

An emergency lighting device includes a housing containing a high voltage connection. A light emitter is connected to the housing. A compartment in the housing having an opening is separated from the high voltage connection. A battery is positioned in the compartment and accessible through the opening.

20 Claims, 10 Drawing Sheets

Related U.S. Application Data continuation of application No. 15/165,765, filed on May 26, 2016, now Pat. No. 9,995,448, which is a continuation of application No. 14/955,497, filed on Dec. 1, 2015, now Pat. No. 10,295,134.

(60) Provisional application No. 62/088,247, filed on Dec. 5, 2014.

(51) Int. Cl.

| | | |
|---|---|---|
| *F21V 15/01* | (2006.01) | |
| *F21V 21/28* | (2006.01) | |
| *F21V 23/02* | (2006.01) | |
| *F21V 23/06* | (2006.01) | |
| *F21V 33/00* | (2006.01) | |
| *H01M 50/204* | (2021.01) | |
| *H01M 50/271* | (2021.01) | |
| *H01M 50/298* | (2021.01) | |
| *H05K 5/02* | (2006.01) | |
| *H05K 5/03* | (2006.01) | |
| *F21W 111/00* | (2006.01) | |

(52) U.S. Cl.
CPC ......... *H05K 5/0217* (2013.01); *H05K 5/0247* (2013.01); *H05K 5/03* (2013.01); *F21W 2111/00* (2013.01); *G09F 2013/05* (2021.05)

(56) References Cited

U.S. PATENT DOCUMENTS

| | | |
|---|---|---|
| 2,478,129 A | 8/1949 | Powell |
| 4,271,621 A | 6/1981 | Garcia et al. |
| 4,435,743 A | 3/1984 | Plumly |
| 5,018,290 A | 5/1991 | Kozek et al. |
| 5,148,158 A | 9/1992 | Shah |
| 5,299,702 A | 4/1994 | Kneer et al. |
| 5,539,623 A | 7/1996 | Gurz et al. |
| 5,564,442 A | 10/1996 | MacDonald |
| 5,768,814 A | 6/1998 | Kozek |
| 5,797,673 A | 8/1998 | Logan et al. |
| 5,911,499 A | 6/1999 | Stafford et al. |
| 6,019,477 A | 2/2000 | Wegrzyn et al. |
| 6,606,808 B2 | 8/2003 | Katz |
| 7,439,463 B2 | 10/2008 | Brenner |
| D627,916 S | 11/2010 | Butteris et al. |
| 7,867,646 B2 | 1/2011 | Rhodes |
| 8,083,376 B2 | 12/2011 | Chien |
| D660,491 S | 5/2012 | Holscher |
| D679,759 S | 4/2013 | Brunelli et al. |
| 9,247,625 B2 | 1/2016 | Recker et al. |
| 2002/0008636 A1 | 1/2002 | Giacannan |
| 2007/0216346 A1* | 9/2007 | Lu .............................. H02J 7/35 320/101 |
| 2008/0061739 A1* | 3/2008 | Lu .......................... H02J 7/0042 320/114 |
| 2010/0039792 A1 | 2/2010 | Meyers |
| 2010/0213849 A1 | 8/2010 | Chien |
| 2010/0325923 A1 | 12/2010 | Dial |
| 2012/0244398 A1 | 9/2012 | Youngs |
| 2012/0281392 A1* | 11/2012 | Workman .................. H02J 7/35 362/183 |
| 2012/0314344 A1 | 12/2012 | Lam et al. |
| 2016/0312968 A1* | 10/2016 | Brunelli .............. F21V 33/0076 |

FOREIGN PATENT DOCUMENTS

| | | |
|---|---|---|
| CN | 101737696 A | 6/2010 |
| CN | 201697023 | 1/2011 |
| CN | 201697023 U | 1/2011 |
| CN | 101963317 A | 2/2011 |

OTHER PUBLICATIONS

Canadian Patent Office Action for Related Application No. 2968857 dated Dec. 9, 2022 (6 pages).
Canadian Office Action, Patent Application No. 2,968,857, issued by the Canadian Intellectual Property Office dated Jan. 26, 2022. (6 pages).
First Office Action dated Sep. 19, 2023 corresponding to China Application No. 202210561672.4, 07 Pages.
English-language translation of Chinese First Office Action dated Sep. 19, 2023 corresponding to China Application No. 202210561672. 4, 6Pages.

\* cited by examiner

FRONT ACCESS BATTERY COMPARTMENT

RELATED APPLICATION(S)

This application is a continuation of U.S. application Ser. No. 16/005,126, filed Jun. 11, 2018, which is a continuation of U.S. application Ser. No. 15/165,765, filed May 26, 2016, which is a continuation of U.S. application Ser. No. 14/955,497, filed Dec. 1, 2015, which is based on provisional application Ser. No. 62/088,247, filed Dec. 5, 2014, the disclosures of which are incorporated herein by reference in their entirety and to which priority is claimed.

FIELD

Various exemplary embodiments relate to front access battery compartments for lighting assemblies and signs.

BACKGROUND

Emergency units, such as exit signs and light fixtures, are commonly used in public buildings to indicate and illuminate areas such as stairs and exits in the event of a power failure. These fixtures typically have an emergency backup power system such as a battery that automatically turns on the emergency light when the primary power source is interrupted.

Once an emergency unit is installed, the batteries need to be replaced every 3 to 5 years. Access to the batteries inside the emergency unit is gained by removing the main front cover to the entire emergency unit. Removing the main front cover exposes the person replacing the battery to voltages from several sources, including line voltage and high voltage from the transformer. Emergency unit batteries should therefore only be replaced by qualified technicians to avoid harm, including electrical shock and death, and damage to the equipment.

SUMMARY

According to an exemplary embodiment, an emergency signaling device includes a housing containing a high voltage connection. A light emitter is connected to the housing. A compartment in the housing having an opening is separated from the high voltage connection. A battery is positioned in the compartment and accessible through the opening.

According to another exemplary embodiment, an emergency light includes a housing, a lamp, a compartment, a battery, and a door. The housing has a front wall and the lamp is connected to the housing. The compartment is positioned in the housing and has an opening accessible through the front wall of the housing. The battery is positioned in the compartment. The door is connected to the housing and covers the compartment opening when in a closed position.

According to another exemplary embodiment, an emergency sign includes an illuminated housing having a faceplate with indicia. A compartment is positioned in the housing and has an opening accessible through the faceplate of the housing. At least one battery is positioned in the compartment. A door is connected to the housing and covers the compartment opening when in a closed position.

BRIEF DESCRIPTION OF THE DRAWINGS

The aspects and features of various exemplary embodiments will be more apparent from the description of those exemplary embodiments taken with reference to the accompanying drawings, in which.

DETAILED DESCRIPTION OF EXEMPLARY EMBODIMENTS

Figure 1:
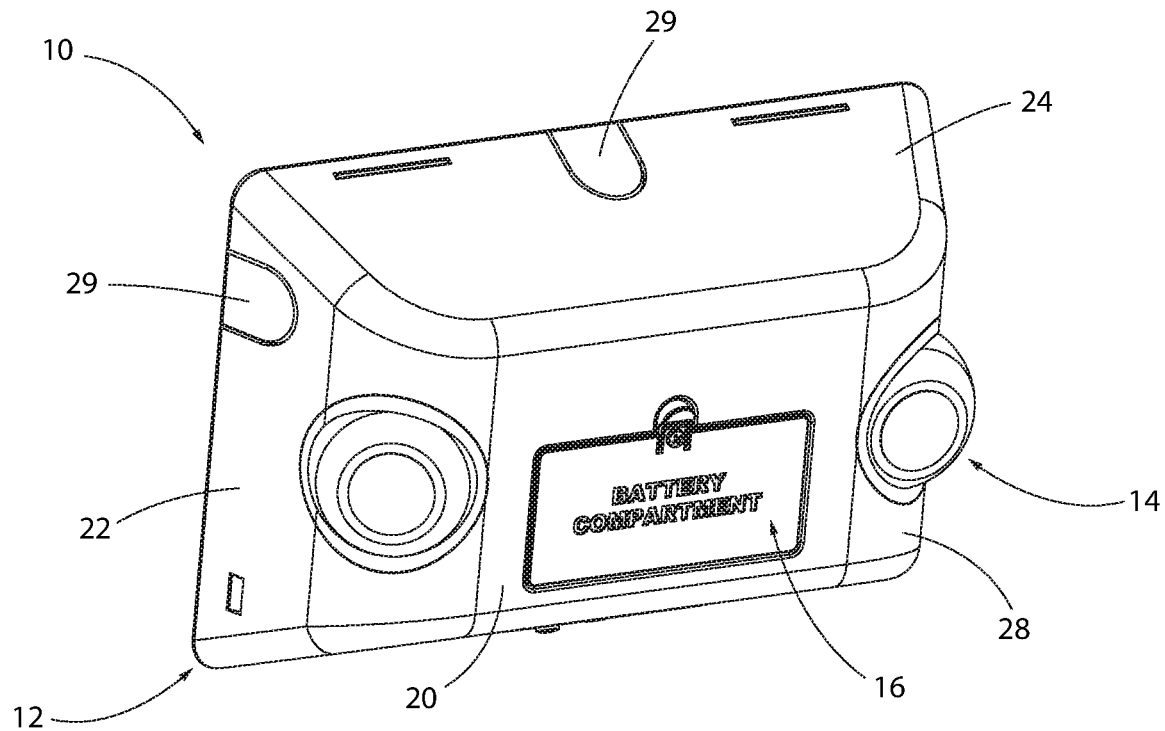
FIG. 1 is a top perspective view of an exemplary emergency light assembly.
Figure 2:
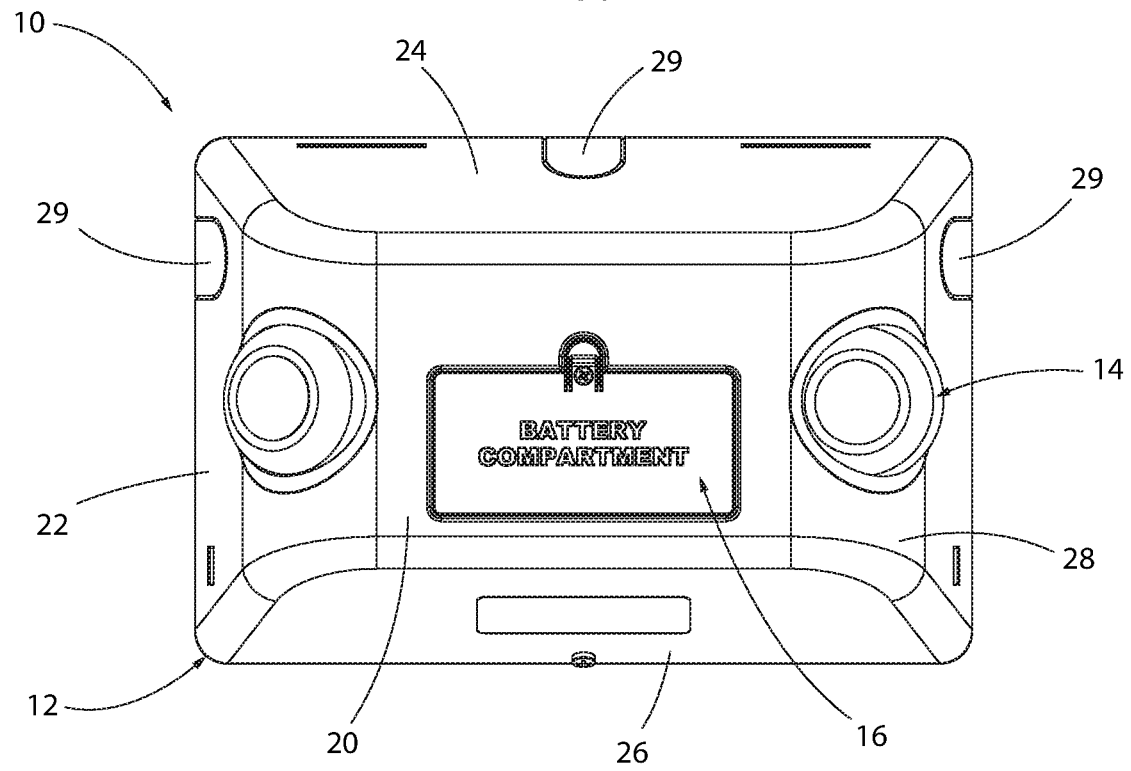
FIG. 2 is a front view of the light assembly of FIG. 1.
Figure 3:
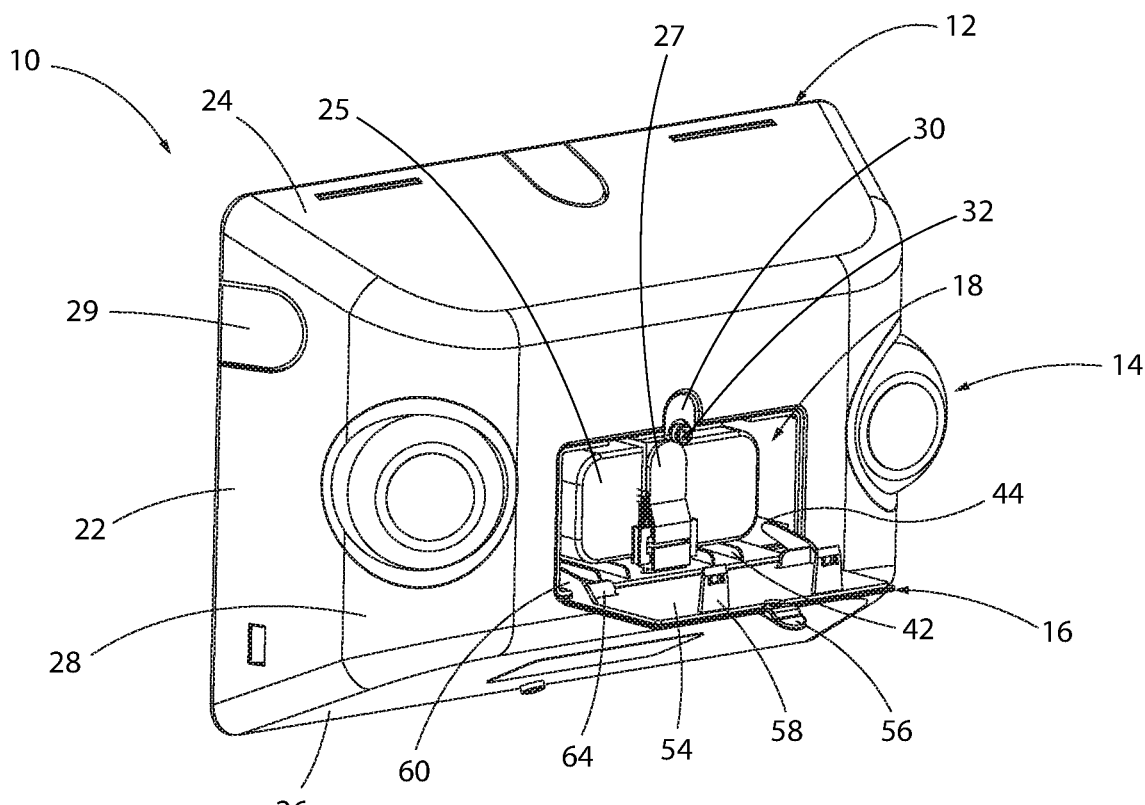
FIG. 3 is a top perspective view of the light assembly of FIG. 1 with the compartment door in the open position.
Figure 4:
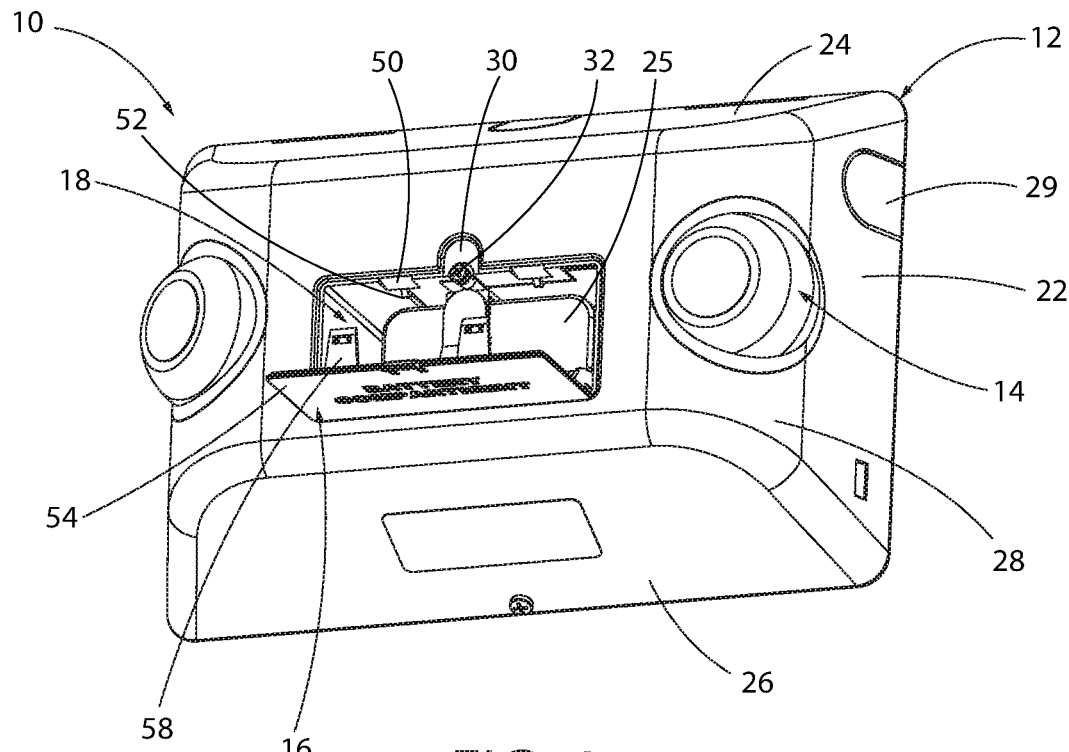
FIG. 4 is a bottom perspective view of the light assembly of FIG. 3.
Figure 5:
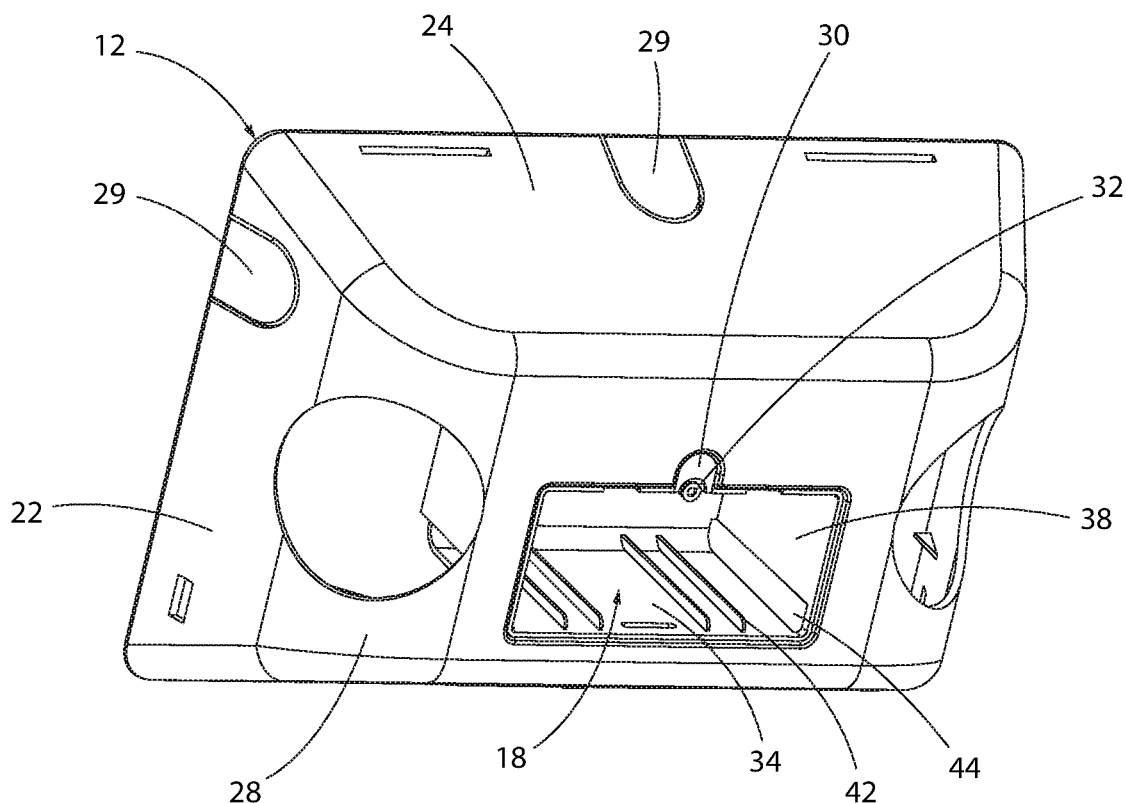
FIG. 5 is a top perspective view of the housing of the light assembly of FIG. 1.
Figure 6:
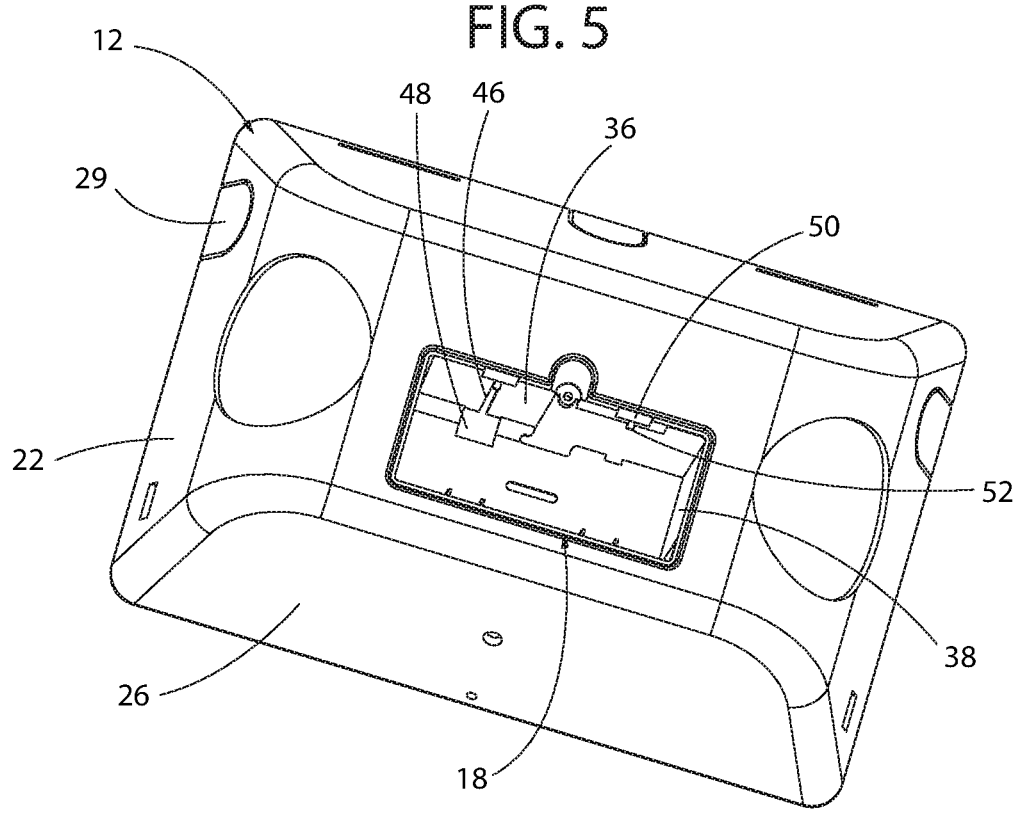
FIG. 6 is a bottom perspective view of the housing of FIG. 5.

According to various exemplary embodiments, an emergency signaling device includes a compartment that allows a user to easily access and replace a battery without exposure to dangerous conditions, such as high voltage sources. The emergency signal emitter can be audio or visual. For example, a front access compartment with a cover can be used to allow access to the battery separate from supply power wiring, eliminating the installer's exposure to high voltages. In various exemplary embodiments, the emergency unit can be a lighting unit that contains a light emitter or other device that requires battery backup, including an emergency lighting assembly, an emergency exit sign, or other emergency devices.

FIGS. 1-10 show an exemplary embodiment of an emergency lighting assembly 10. The lighting assembly includes a housing 12, one or more lamps 14, and a door 16 covering a battery compartment 18.

The housing 12 in the illustrated exemplary embodiment has a front wall 20, inclined side walls 22, an inclined top wall 24, and an inclined bottom wall 26. Rounded corners 28 or other transitions can connect the walls. One or more of the walls 22, 24, 26 can include one or more knockouts 29. For example, a knockout 29 can be positioned in both of the side walls 22 and the top wall 24. The knockouts 29 can be selectively removed to provide one or more wire openings for the housing 12.

The lamps 14 extend through openings in the housing, for example, positioned mainly in the rounded corners 28. Side walls 22 are oriented at an incline with respect to the front wall 20 to direct light in a generally outward and forward direction with respect to the housing 12. The housing 12 and lamp 14 can have various alternative configurations depending on the desired light output, strength, and direction. The housing 12 can be made from a molded plastic material, metal, composite, or other suitable rigid material.

Each of the lamps 14 can be independently adjusted to direct the beam of light produced from the lamp 14 to a selected area. In an exemplary embodiment, the lamps 14 can pivot and swivel within a socket in the housing 12. The lamps 14 can include any suitable light source, for example light emitting diodes (LED) or halogen light sources.

The light assembly 10 is connected to a main power source (not shown) and includes a battery 25 for providing auxiliary power. In an exemplary embodiment, the internal circuitry and the lamps 14 are connected to the battery by wires or another electrical connection. The light assembly 10 is then connected to a main power source to maintain the battery 25 in a charged condition. Typically, the light assembly 10 is wired to an electrical junction box or electrical receptacle as known in the art. Circuitry actuates the lamps 14 when certain conditions are present, for example an alarm is activated or the primary source of power is interrupted.

As best shown in FIGS. 3-6, the exemplary housing includes a compartment 18 for housing the battery 25. The compartment 18 is accessible through the front of the housing 12 without removing the housing 12 or otherwise exposing high voltage components, such as conductors or circuitry. The compartment 18 is covered by a moveable door 16 that can be selectively opened and closed by a user. The battery 25 can be secured in the housing 12 by a strap 27. The strap 27 can be feed through one or more slots in the compartment 18. The strap 27 can utilize a releasable fastener, for example a hook-and-loop fastener, buckle, clip, etc.

The front wall 20 includes a depression 30 adjacent the compartment 18 opening and a boss 32 extending into the compartment 18. The compartment 18 includes a bottom wall 34, top wall 36, side walls 38 extending from the front wall 20 toward the rear of the housing 12, and a back wall 40 connected to one or more of the other walls 34, 36, 38. The top wall 36 can include an undercut portion and the back wall 40 can include a slot for receiving the strap 27.

Figure 7:
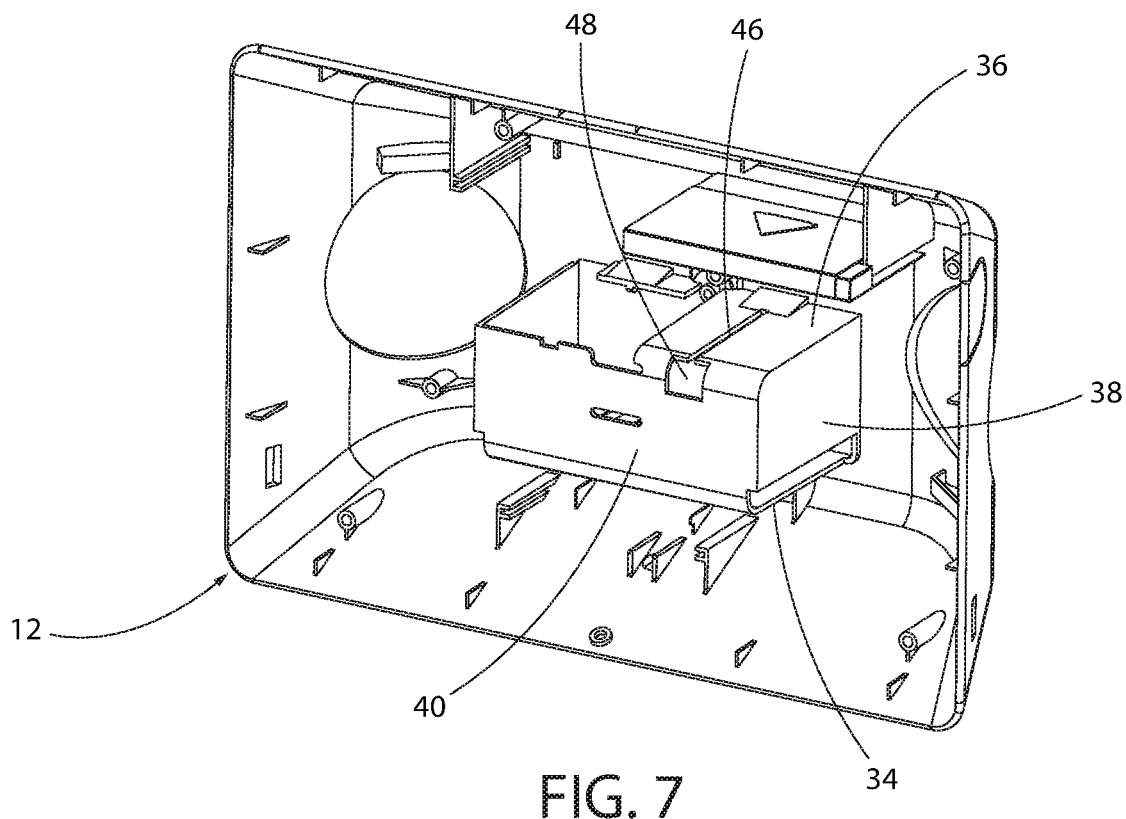
FIG. 7 is a rear perspective view of the housing of FIG. 5.
Figure 8:
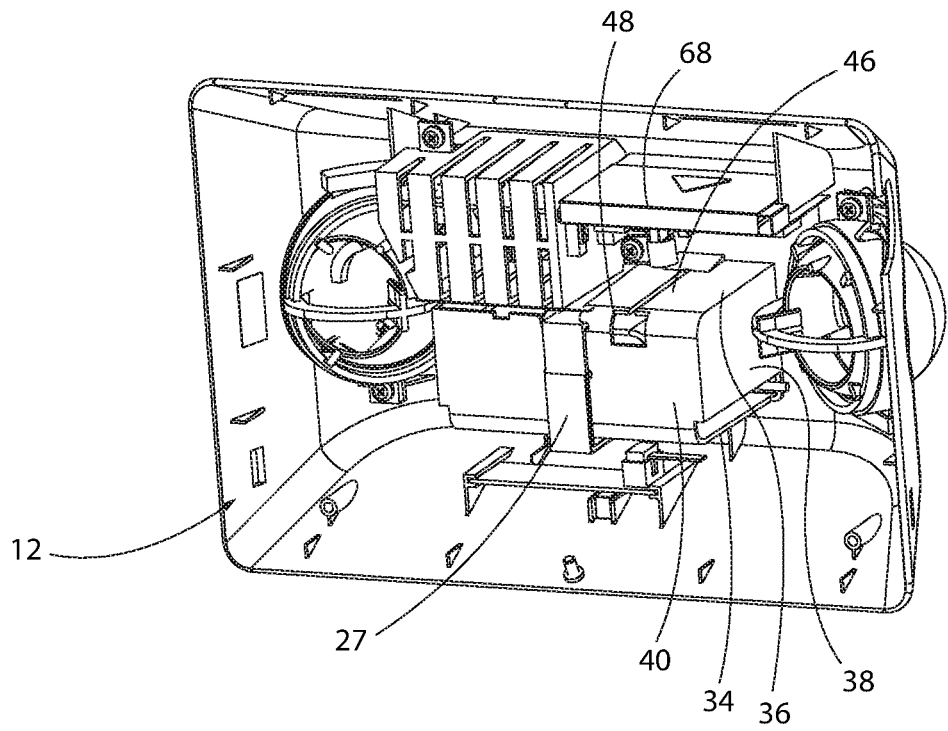
FIG. 8 is a rear perspective view of the light assembly of FIG. 1.

In an exemplary embodiment, the bottom wall 34 includes one or more sets of protrusions 42 defining a groove. Slots 44 are positioned adjacent the bottom wall 34 and the side walls 38 to retain the door 16. The top wall 36 extends at least partially over the compartment 18 and includes a channel 46 and an aperture 48 that extends into and through the back wall 40 as best shown in FIGS. 7 and 8. One or more angled grooves 50 and projections 52 are provided in the compartment 18. For example a first angled groove 50 and projection 52 are provided on the top wall 36 and a second angled groove 50 and projection 52 are provided on a flange extending over the compartment 18. The grooves 50 and projections 52 are configured to engage the door 16.

Figure 9:
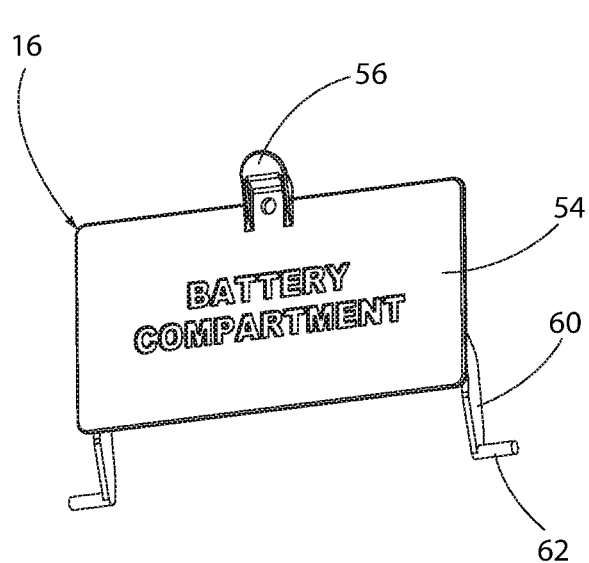
FIG. 9 is a front perspective view of the door of FIG. 1.
Figure 10:
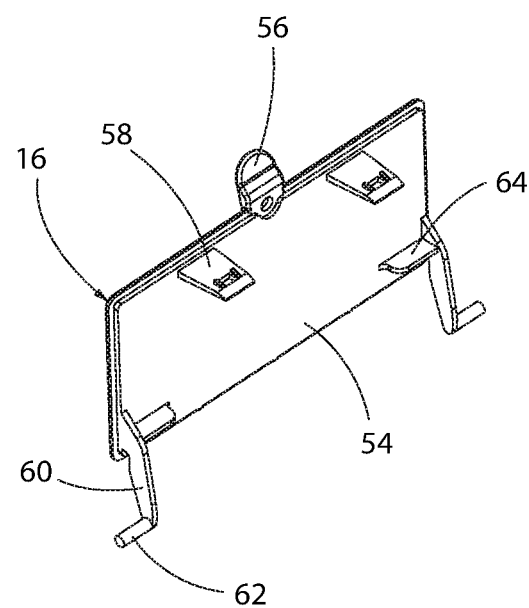
FIG. 10 is a rear perspective view of the door of FIG. 9.

The door 16, according to the exemplary embodiment and best shown in FIGS. 9 and 10 includes a cover 54 having a front surface and a back surface. An angled tab 56 extends upward from the cover 54, although other alternative configurations may be used. One or more clips 58, for example first and second clips 58 having an opening, extend rearward from the back surface of the cover 54. First and second legs 60 extend downward from the back surface of the cover 54. A pin 62 extends from each of the first and second legs 60. Flaps 64 extend from the back surface of the cover 54. The cover can be made from a variety of materials, including non-conductive materials such as molded plastic, although other rigid materials may be used.

The pins 62 extend into the slots 44 to pivotally connect the door 16 to the housing 12. When the door 16 is in the closed position, the clips 58 engage the grooves 50 and projections 52 and the tab 56 rests in the depression 30. The projections 52 extend into the openings of the clips 58 to releasable secure the door 16 in the closed position. A fastener, for example a screw, can be inserted through the tab 56 and into the boss 32 to secure the cover 16 to the housing 12. The tab 56 can include an aperture for receiving the screw. Other connections, including other hinge or pivotal connections or a non-hinged, separable connection can be made between the door 16 and the housing 12.

Figure 11:
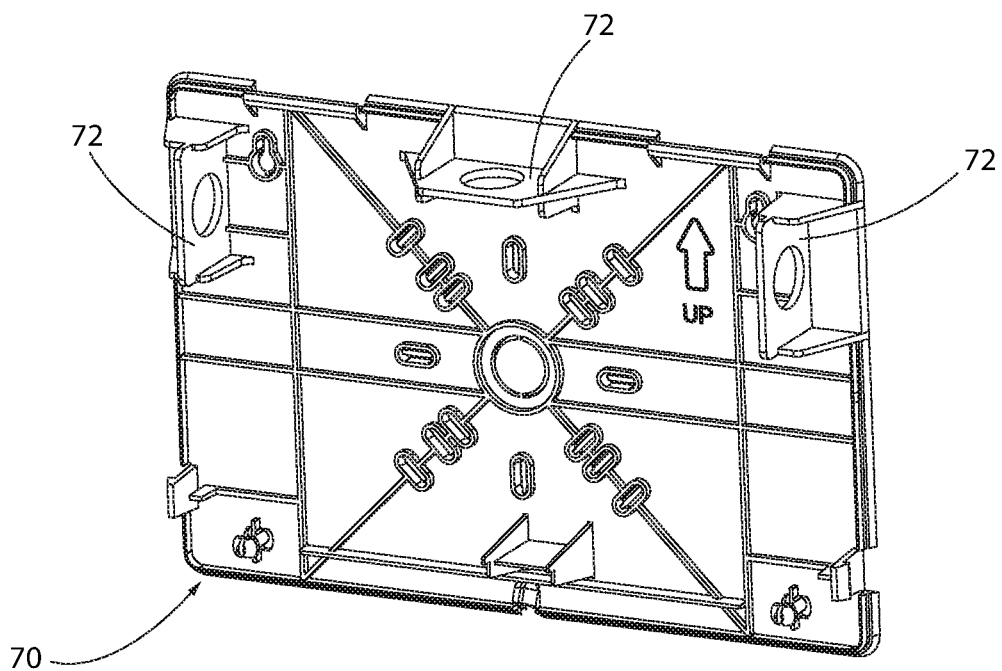
FIG. 11 is a perspective view of an exemplary mounting plate.
Figure 11A:
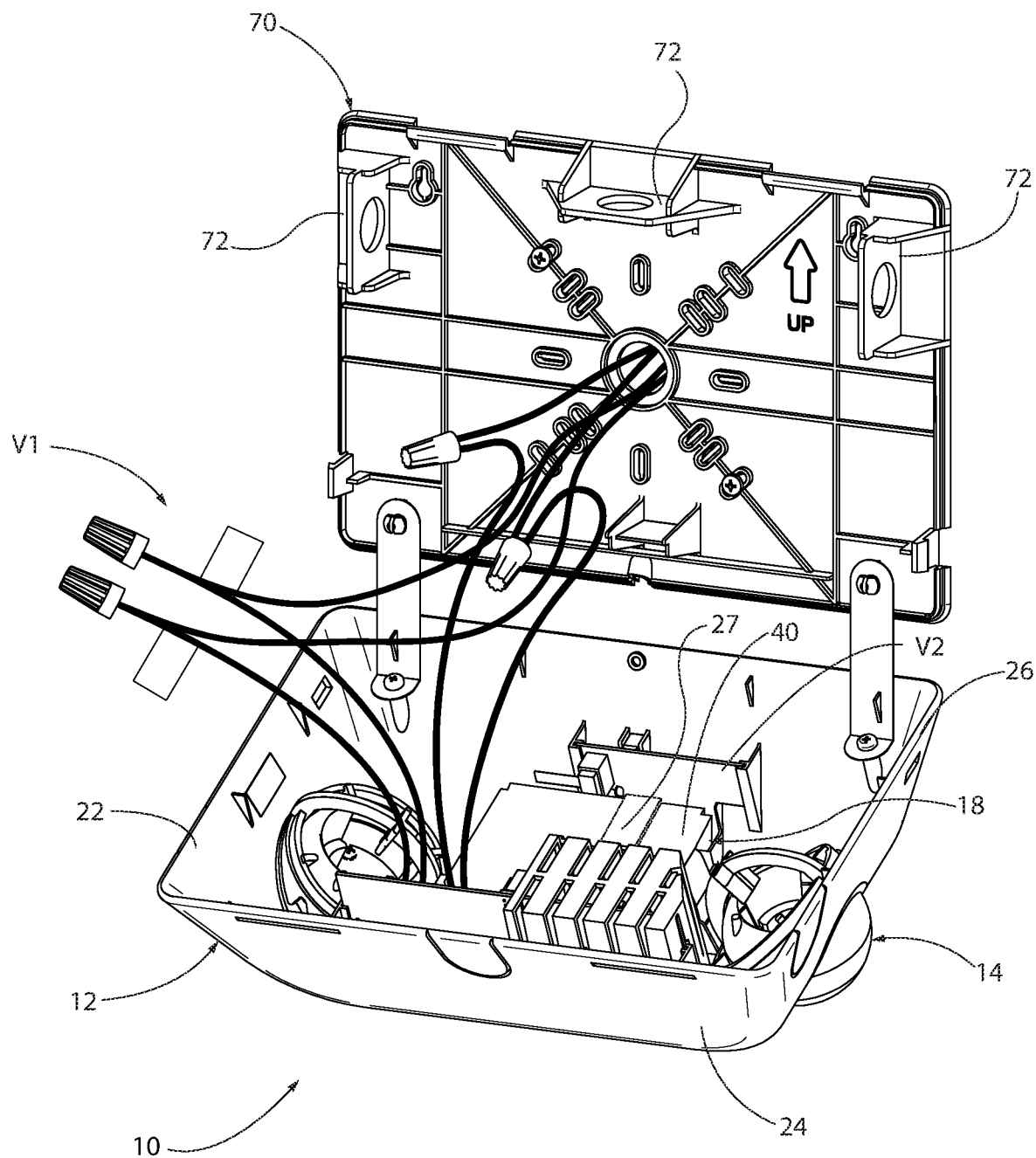
FIG. 11A is a perspective view of the light assembly partially connected to the mounting plate of FIG. 11.

The compartment 18 holds the battery 25 but isolates and/or limits an installer from touching high voltage components, such as power supply conductors V1 or charging circuits V2 inside the housing 12 as shown in FIG. 11A. The battery's low voltage is supplied to the main unit via wires that are routed through an opening in the back of the battery compartment. The battery 25 can therefore be easily changed by a user without moving the housing 12 and without risk to injury.

As best shown in FIG. 7, the interior of the housing 12 includes various structural elements to secure required electrical components and the battery 25. The light assembly 10 contains suitable electrical components for powering and activating the lamps 14, for example electrical conductors and circuitry as shown in FIG. 8 and would be understood by one of ordinary skill in the art. Certain components, including portions of the wiring have been removed from FIG. 8 for clarity.

In an exemplary embodiment, a charger 68, for example a PCB mounted charger, is secured to the housing 12. The charger 68 can include an electrical connector that extends into the compartment 18, for example through the channel 46 or aperture 48. The electrical connector can be a series of wire conductors and a wire harness connector, although other suitable types of electrical connectors, including wire conductors or other releasable connectors can be used FIG. 11 shows an exemplary mounting plate 70 that can be used with the housing 12. The mounting plate 70 is attached to a support, for example a wall, ceiling or other structure. The interior of the housing 12 can include one or more mounting features, for example protrusions, bosses, slots, pins, clips, or any combination thereof that allow the housing 12 to connect to a mounting plate 70. The housing 12 can releasably connect to the mounting plate 70, for example through a snap connection. The mounting plate 70 has various mounting features, for example for example protrusions, bosses, slots, pins, clips, or any combination thereof to engage the housing 12. One or more hinge members can also be provided to allow the mounting plate 70 to pivot with respect to the housing 12. The mounting plate 70 includes tabs 72 that have openings that align with the knockouts 29. In other alternative embodiments, the housing 12 can be connected to the mounting plate, or directly to a structure, with straps or fasteners.

Figure 12:
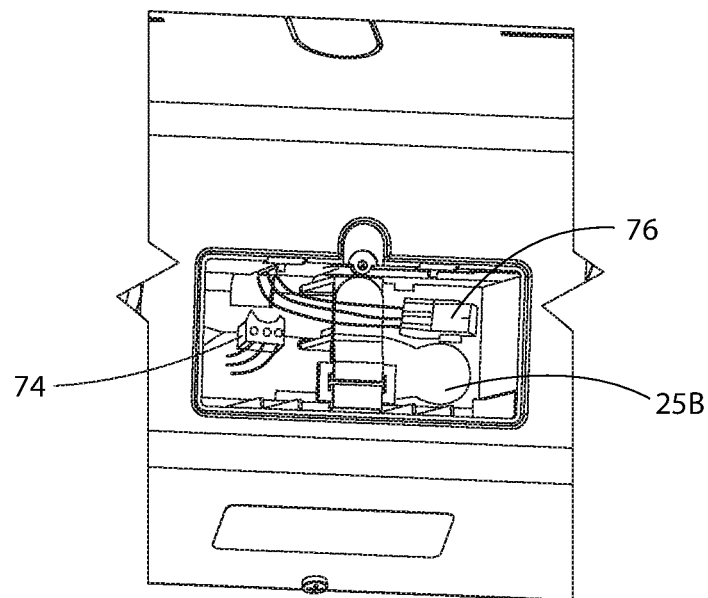
FIG. 12 is a partial perspective view of the light assembly of FIG. 1 with an alternative exemplary battery and wire connector.

FIG. 12 shows an alternative embodiment of a multiple cell battery pack 25B with an attached connector 74. The battery connector 74 can be a series of wire conductors and a wire harness connector as shown, although other suitable type of electrical connectors, including wire conductors or other releasable connectors can be used. The battery 25B is placed in the compartment 18 and the battery connector 74 is coupled to a charger connector 76, allowing the battery 25B to be charged by the charger 68 and allowing the battery 25B to provide electrical power to the lamps 14.

Figures 13, 14:
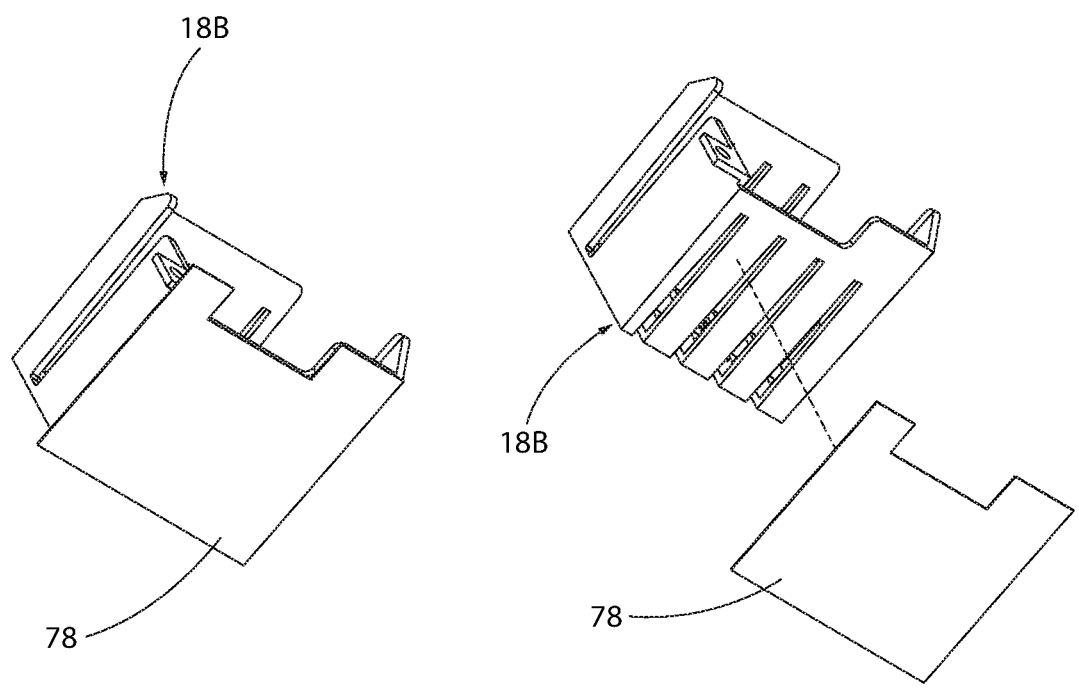
FIG. 13 is a bottom perspective view of an alternative exemplary compartment.
FIG. 14 is an exploded perspective view of FIG. 12.

FIGS. 13 and 14 show an exemplary embodiment of the battery compartment 18B that is separately formed and can be attached to a housing, for example through fasteners, adhesives, or a joining process. The compartment 18B includes a cover 78 to assist in shielding the interior of the compartment 18B.

Figure 15:
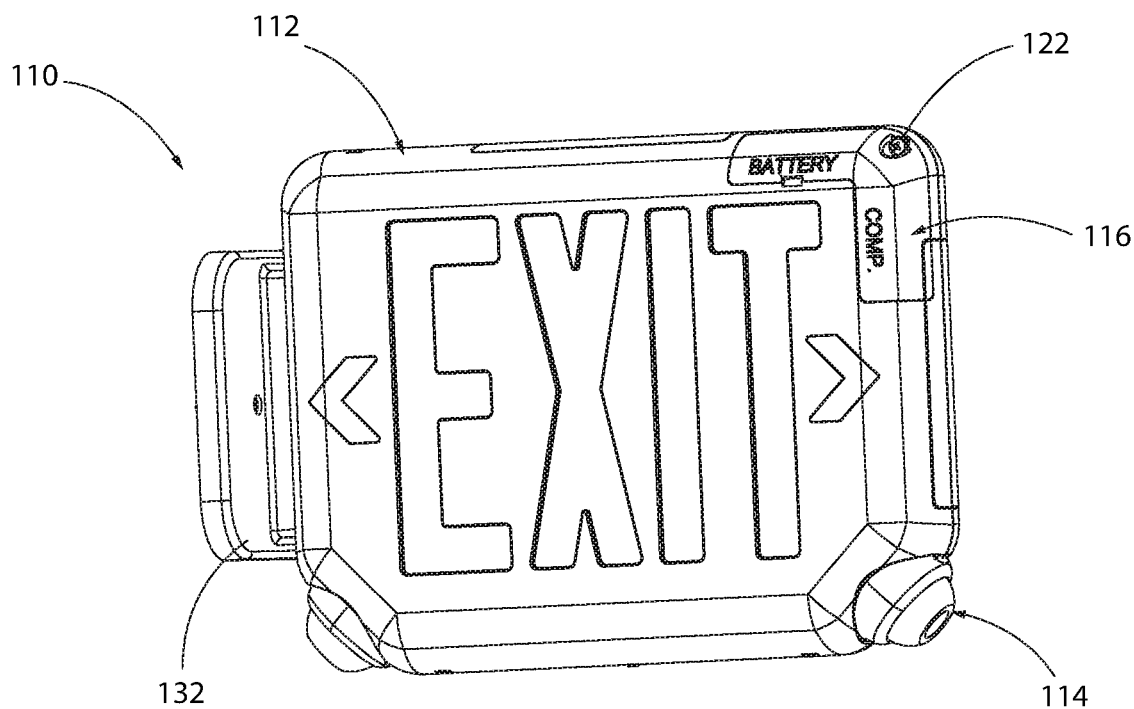
FIG. 15 is a front perspective view of an alternative exemplary emergency light assembly.
Figure 16:
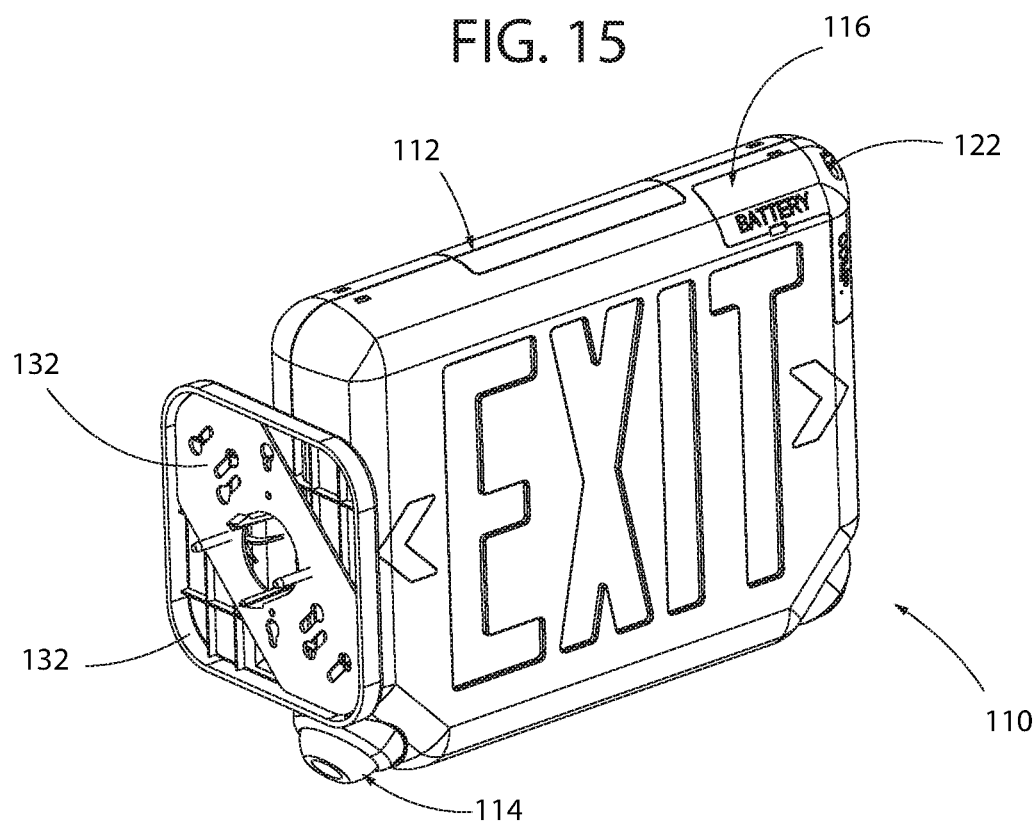
FIG. 16 is side perspective view of the light assembly of FIG. 14.
Figure 17:
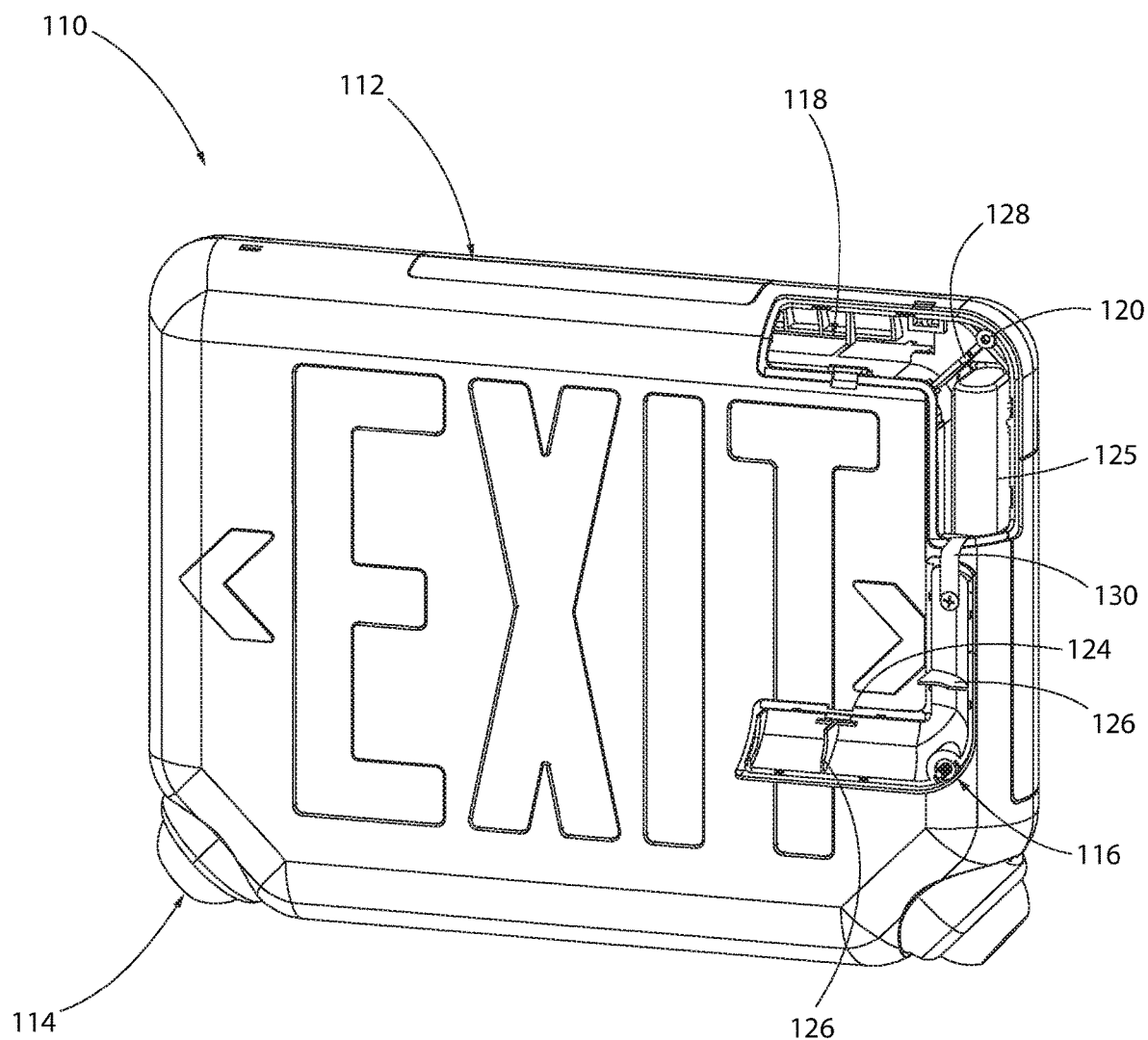
FIG. 17 is a front perspective view of the light assembly of FIG. 14 with the door and one battery removed.
Figure 18:
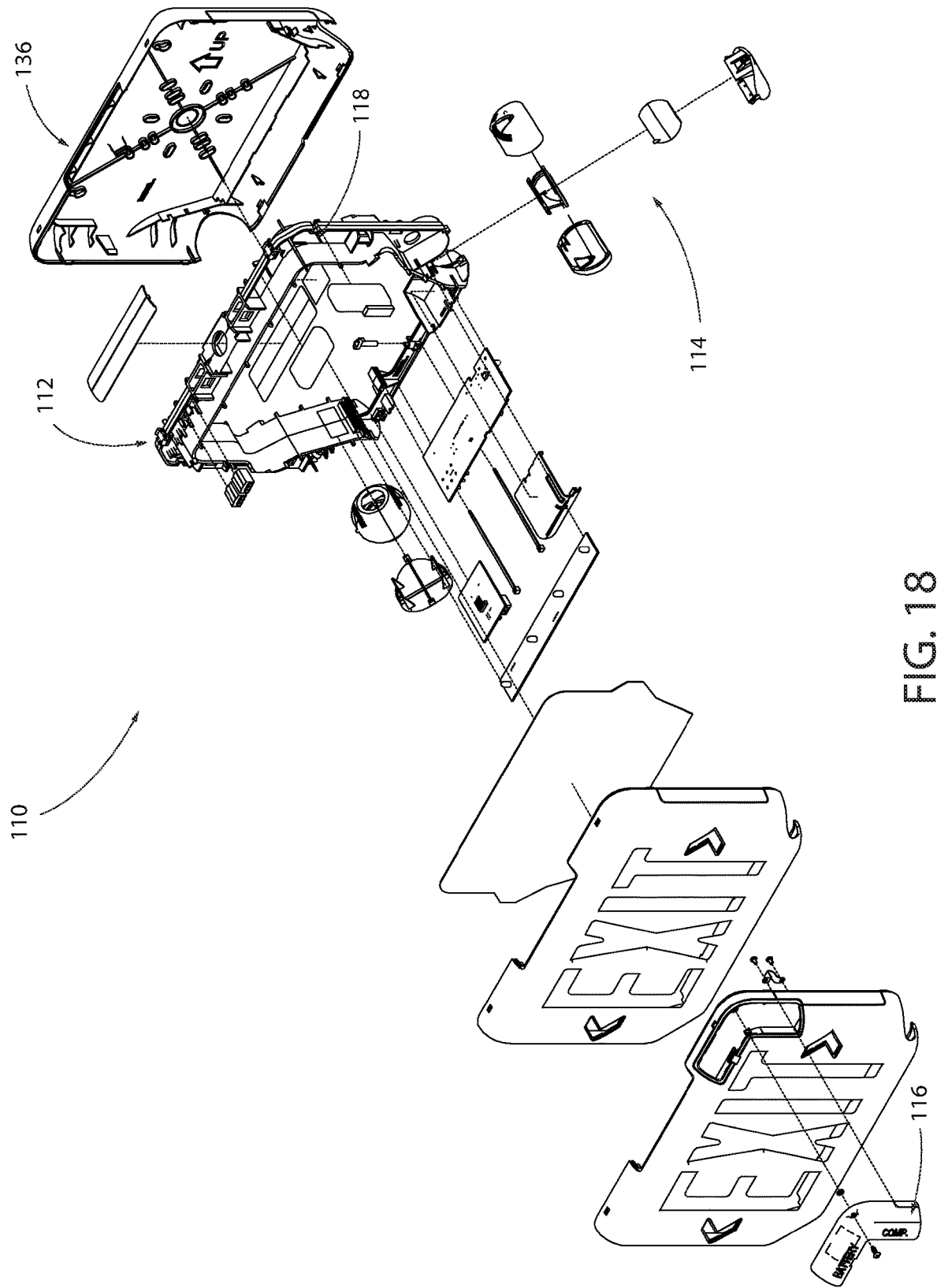
FIG. 18 is a perspective exploded view of the light assembly of FIG. 14.

FIGS. 15-18 show another exemplary embodiment of a lighting assembly that is an illuminated emergency exit sign no. FIGS. 15 and 16 show an exemplary embodiment of the exit sign no that includes a side mounting extension 132 and bracket 134. FIGS. 17 and 18 show an exemplary embodiment of the exit sign no having a rear mounting plate 136.

The exit sign 110 includes a housing 112, one or more lamps 114, and a door 116 covering a battery compartment 118. The door 116 and the battery compartment 118 have a substantially L shape. The battery compartment 118 houses first and second batteries 125. The battery compartment 118 includes a threaded aperture 120 that receives a fastener 122 extending through the door 116. The door 116 has an outer flange that mates with a recess in the housing 112 so that the door 116 fits flush against the housing. A slot 124 is provided in the door 116 so it can be removed from the housing by a user after the fastener 122 has been removed. The door 116 includes a set of first flanges 126 that hold the battery 125 in place and the compartment 118 includes a second flange 128 that separates the first and second batteries 125. The batteries 125 can be connected through a wire harness, contacts, or other suitable electrical connection. In an exemplary embodiment, a strip 130 connects to the door 116 and the compartment 118 to assist in retaining the door 116 when it is removed from the compartment 118.

The foregoing detailed description of the certain exemplary embodiments has been provided for the purpose of explaining the principles of the invention and its practical application, thereby enabling others skilled in the art to understand the invention for various embodiments and with various modifications as are suited to the particular use contemplated. This description is not necessarily intended to be exhaustive or to limit the invention to the exemplary embodiments disclosed. Any of the embodiments and/or elements disclosed herein may be combined with one another to form various additional embodiments not specifically disclosed. Accordingly, additional embodiments are possible and are intended to be encompassed within this specification and the scope of the appended claims. The specification describes specific examples to accomplish a more general goal that may be accomplished in another way.

As used in this application, the terms "front," "rear," "upper," "lower," "upwardly," "downwardly," and other orientational descriptors are intended to facilitate the description of the exemplary embodiments of the present invention, and are not intended to limit the structure of the exemplary embodiments of the present invention to any particular position or orientation. Terms of degree, such as "substantially" or "approximately" are understood by those of ordinary skill to refer to reasonable ranges outside of the given value, for example, general tolerances associated with manufacturing, assembly, and use of the described embodiments.

What is claimed:

1. An emergency lighting device comprising:
    a housing having a top wall, a bottom wall, and a pair of side walls at least partially defining an interior compartment;
    a first adjustable light assembly connected to the housing;
    a second adjustable light assembly connected to the housing;
    a battery compartment positioned in the housing;
    a rechargeable battery positioned in the battery compartment;
    a charging circuit positioned in the housing; and
    a conductor extending into the battery compartment to electrically connect the rechargeable battery to the charging circuit, wherein the battery compartment isolates a user accessing the rechargeable battery from directly or indirectly contacting all high voltage components.

2. The emergency lighting device of claim 1, wherein the rechargeable battery provides auxiliary power to the first and second light emitters.

3. The emergency lighting device of claim 1, wherein the first and second light emitters are pivotally connected to the housing.

4. The emergency lighting device of claim 1, further comprising a strap for retaining the rechargeable battery in the battery compartment.

5. The emergency lighting device of claim 1, further comprising a door secured to the housing by a threaded fastener.

6. The emergency lighting device of claim 1, wherein the conductor is connected to the battery by a wire harness.

7. The emergency lighting device of claim 1, wherein the battery compartment includes a compartment top wall, a compartment bottom wall, a compartment side wall, and a compartment back wall.

8. The emergency lighting device of claim 7, wherein at least one of the compartment top wall, compartment bottom wall, the compartment side wall, and the compartment back wall includes an aperture.

9. The emergency lighting device of claim 1, wherein a high-voltage conductor is positioned in the housing and electrically connects the charging circuit to a power supply.

10. An emergency sign comprising:
    a housing having a faceplate with indicia, a first compartment, and a second compartment, wherein a second compartment opening provides access to the second compartment through the faceplate;
    a high-voltage connection positioned in the first compartment;
    at least one battery positioned in the second compartment; and
    a door connected to the housing and covering the second compartment opening when in a closed position, wherein the second compartment is isolated from all high-voltage components such that a user accessing the at least one battery is isolated from directly or indirectly contacting all high-voltage components.

11. The emergency sign of claim 10, wherein the second compartment includes a first portion configured to receive a first battery and a second portion configured to receive a second battery.

12. The emergency sign of claim 11, wherein the second compartment has an L-shaped configuration.

13. The emergency sign of claim 11, wherein the door includes a flange configured to separate the first battery and the second battery.

14. The emergency sign of claim 10, further comprising a side mounting extension extending from the housing.

15. The emergency sign of claim 10, wherein the housing includes a rear mounting plate.

16. The emergency sign of claim 10, wherein a first light emitter and a second light emitter are connected to the housing.

17. The emergency sign of claim 15, wherein the first and second light emitters are moveable.

18. The emergency sign of claim 10, wherein a strap connects the door to the housing.

19. The emergency sign of claim 10, wherein the door includes a flange configured to engage the battery.

20. The emergency sign of claim 10, further comprising a fastener configured to secure the door to the housing.

\* \* \* \* \*